(12) United States Patent
Feldman et al.

(10) Patent No.: US 6,404,481 B1
(45) Date of Patent: Jun. 11, 2002

(54) ADAPTIVE LITHOGRAPHY MEMBRANE MASKS

(75) Inventors: Martin Feldman, Baton Rouge, LA (US); Henry I. Smith, Sudbury, MA (US); Ken-Ichi Murooka, Yokohama (JP); Michael H. Lim, Cambridge, MA (US)

(73) Assignees: Board of Supervisors of Louisiana State University and Agricultural and Mechanical College, Baton Rouge, LA (US); Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/578,573

(22) Filed: May 25, 2000

(51) Int. Cl.[7] .................. G03B 27/68; G03B 27/52; G03B 27/42; G21K 5/00
(52) U.S. Cl. .................. 355/52; 355/30; 355/53; 355/67; 355/72; 378/34; 378/35
(58) Field of Search .................. 378/34, 35; 355/30, 355/53, 67, 72, 52

(56) References Cited

U.S. PATENT DOCUMENTS

| | | | | |
|---|---|---|---|---|
| 4,194,233 A | * | 3/1980 | Jones | 361/233 |
| 5,155,749 A | | 10/1992 | DiMilia et al. | 378/35 |
| 5,260,151 A | * | 11/1993 | Berger et al. | 430/5 |
| 5,316,879 A | * | 5/1994 | Berger et al. | 430/5 |
| 5,504,793 A | | 4/1996 | Chen | 378/34 |
| 6,212,252 B1 | * | 4/2001 | Kise et al. | 378/35 |
| 6,228,544 B1 | | 5/2001 | Ota | 430/30 |

OTHER PUBLICATIONS

Aoyama, H. et al., "Magnification correction by changing wafer temperature in proximity X–ray lithography," *J. Vac. Sci. Technol. B*, vol. 17, pp. 3411–3414 (1999).

Feldman, M., "Thermal Compensation of X–ray Mask Distortions," Poster presented at the 43rd International Conference on Electron, Ion and Photo Beam Technology and Nanofabrication (Marco Island, Florida, Jun. 1–4, 1999).

Feldman, M., "Thermal Compensation of X–ray Mask Distortions," *J. Vac. Sci. Technol. B*, vol. 17, pp. 3407–3410 (1999).

(List continued on next page.)

Primary Examiner—Russell Adams
Assistant Examiner—Khaled Brown
(74) Attorney, Agent, or Firm—John H. Runnels

(57) ABSTRACT

Techniques are disclosed to compensate for distortions in lithography by locally heating the membrane in a lithographic mask. The techniques may be used both to shrink and to expand areas of the mask locally, in order to adjust for varying magnitudes and signs of distortion. In one embodiment the correction method comprises two steps: (1) A send-ahead wafer is exposed and measured by conventional means to determine the overlay errors at several points throughout the field. (2) During exposure of subsequent wafers, calibrated beams of light are focused on the mask. The heating from the absorbed light produces displacements that compensate for the overlay errors measured with the send-ahead wafer. Any source of distortion may be corrected—for example, distortion appearing on the mask initially, distortion that only develops on the mask over time, or distortion on the wafer. In another embodiment, a reference pattern is formed on the membrane as a means of measuring mask distortion, and the heat input distribution needed to correct distortion is determined by subsequent measurements of the reference pattern. In this alternative embodiment, any source of distortion in the mask may be corrected.

19 Claims, 8 Drawing Sheets

OTHER PUBLICATIONS

Feldman, M. et al., "Thermal Compensation of X–ray Mask Distortions," Abstract of Poster presented at the 43rd International Conference on Electron, Ion and Photo Beam Technology and Nanofabrication (Marco Island, Florida, Jun. 1–4, 1999).

Feldman, M. et al., "Wafer chuck for magnification correction in X–ray lithography," *J. Vac. Sci. Technol. B,* vol. 16, pp. 3476–3479 (1998).

Fisher, A. et al., "Pattern transfer on mask membranes," *J. Vac. Sci. Technol. B,* vol. 16, pp. 3572–3576 (1998).

Murooka, K. et al., "Membrane–mask distortion correction: analytical and experimental results," paper to be presented at the International Conference on Electron, Ion, and Photo Beam Technology and Nanofabrication (Palm Springs, CA, May 20 to Jun. 2, 2000).

(unpublished) pending proposal to DARPA BAA 00–4 (prepared Feb. 8, 2000).

U.S. application No. 09/578,573, Feldman, filed May 25, 2000.

U.S. application No. 09/578,572, Feldman, filed May 25, 2000.

* cited by examiner

ADAPTIVE LITHOGRAPHY MEMBRANE MASKS

The development of this invention was partially funded by the Government under contract number N00019-98-K-0110 awarded by the Defense Advanced Projects Research Agency. The Government has certain rights in this invention.

This invention pertains to apparatus and methods for compensating distortions in membrane lithography masks, wafers, or both.

The size of circuit elements used in state-of-the-art integrated circuits continues to decrease. New lithography techniques will be needed to continue this reduction to sizes much smaller than those currently in use. Proximity X-ray lithography is a particularly promising technique, as it allows the largest exposure field of any of the contenders for the next generation of integrated circuit lithography, on the order of 5 cm×5 cm in a single exposure. The large exposure field provides a significant throughput advantage, but it also makes image placement more critical, to the point where accurate image placement is widely regarded as a major factor limiting the use of X-ray lithography in very large scale integrated ("VLSI") circuits. Overlay errors in proximity X-ray lithography may arise from several factors, including for example the following: (1) errors in the pattern writing tool; (2) distortions in the membrane mask caused, for example, by stresses in the absorber; and (3) distortions that are already present in the pattern on the wafer. Much effort has gone into minimizing all three effects, as well as at least partially compensating them by adjusting the magnification.

The industry's response to this critical problem has typically been to design masks that are as rigid as possible, to try to minimize one potential cause of distortion at its source. While other types of masks are inherently more rigid, the inherent rigidity of membrane masks is relatively low. The rigidity of membrane masks has been increased, for example, by the use of diamond substrates. Membrane masks are currently required for X-ray lithography, ion beam lithography, and some types of e-beam lithographies. Although membrane masks may in principle be used in almost all lithography techniques, they have generally been considered less desirable. One approach in a projection electron beam system (the so-called SCALPEL system) has been to reinforce the required membrane masks with "grillage" to increase their rigidity.

The type of "membrane mask" used in X-ray lithography comprises a membrane and an absorber. The membrane is a continuous sheet that is relatively transparent to the radiation used to expose a resist on a wafer. The main function of the membrane is to support the absorber. The absorber, which adheres to the membrane, is relatively opaque to the radiation. The absorber is patterned to correspond with the pattern desired in the exposed and developed resist on the wafer, and need not be continuous since it adheres to the membrane.

In other lithographies, other types of membrane masks have been used. For example, the membrane may be opaque to the radiation, except where holes are placed in the membrane (so-called "stencil" masks). Alternatively, the absorber may be replaced by a patterned layer that scatters incident radiation instead of absorbing it.

Generally, the industry has addressed the problem of distortion by trying to manufacture masks that are as accurate as possible, considering the ideal to be features positioned on orthogonal, perfectly linear axes. Much of the cost of mask-patterning tools lies in the references, metrology, and feedback used to enhance accurate image placement. However, this approach cannot accommodate changes in a mask that occur in processing steps subsequent to resist exposure, nor accommodate changes that occur as a mask ages, nor match a mask to distortions that may exist on the wafer being exposed.

A technique called "pattern-specific emulation" has been used to compensate for distortion in X-ray masks, such as distortion caused in etching the absorber. In this method a "send ahead" mask is first made, and is then used to expose a level on a wafer. Pattern displacements from the desired positions are noted, and are fed back to the mask-writing tool. A new mask is then written incorporating these displacements. Although time consuming and costly, this method did improve overlay. See, e.g., A. Fisher et al., "Pattern transfer on mask membranes," *J. Vac. Sci. Technol. B*, vol. 16, pp. 3572–3576 (1998).

R. L. Engelstad and F. Cerrina of the University of Wisconsin have considered the displacement of features on a membrane mask by heated gas jets (private communication).

Magnification correction is considered one of the critical issues in lithography. In some lithographic techniques, magnification correction has been accomplished by an adjustment of the exposure tool. For example, in projection optical lithography it is routine to adjust the magnification by axial displacement of the reticle and refocusing in a projection system which is non-telecentric on the reticle side. Similarly, adjusting the gap in point-source X-ray lithography changes the magnification. Adjusting magnification is more difficult in storage-ring X-ray lithography.

It has also been proposed to correct for magnification errors by expanding or contracting either the mask or the wafer. Both mechanical and thermal means have been suggested for correcting magnification errors.

U.S. Pat. No. 5,155,749 discloses expansion of an X-ray membrane mask by heating a support ring to facilitate magnification matching between the mask and the wafer.

A method has been proposed to correct magnification errors by preheating the wafer, and then vacuum-chucking it so that its size is "frozen in" by the chucking force when the wafer is cooled back down. See H. Aoyama et al., "Magnification correction by changing wafer temperature in proximity X-ray lithography," *J. Vac. Sci. Technol. B*, vol. 17, pp. 3411–3414 (1999).

U.S. Pat. No. 5,504,793 discloses a method for applying torque to an X-ray mask at severallocations around its edge with mechanical actuators, to stretch or compress the mask membrane to provide magnification correction.

It has been proposed to mount the wafer on a spherical vacuum chuck, and to adjust the size of the front surface by changing the radius of the chuck via application of an internal pressure or vacuum. See M. Feldman et al., "Wafer chuck for magnification correction in X-ray lithography," *J. Vac. Sci. Technol. B*, vol. 16, pp. 3476–3479 (1998).

A novel method has been discovered, called the adaptive membrane mask technique, for locally heating the membrane in a lithographic mask to compensate for distortion in the mask, the wafer, or both. This technique may be used both to shrink and to expand areas of the mask, in order to adjust for varying magnitudes and signs of distortion. The adaptive membrane mask represents a major change in philosophy, from increasingly costly and difficult "dead reckoning" methods to one using feedback.

In one embodiment, the correction method comprises two steps: (1) A send-ahead wafer is exposed and measured by conventional means to determine the overlay errors at several points throughout the field. The errors may be the result of distortion in the mask, in the wafer, or both. (2) During exposure of subsequent wafers, calibrated beams of light are focused on the mask. The source of light may be, for example, a modulated laser beam, a halogen lamp, a capillary lamp, or a cathode ray tube. The light could have wavelengths from infrared to visible to ultraviolet. The light may be scanned across the mask, or projected on the mask directly or through a transparency or liquid crystal array, or produced by another projection system. The heating from the absorbed light produces displacements that compensate for the overlay errors measured with the send-ahead wafer. While heating a portion of a mask causes it to expand, a portion of a mask may also effectively be shrunk by heating the areas surrounding it.

In some circumstances, an alternative embodiment may be preferred. There is a delay inherent in the send-ahead wafer technique, due to the time required to develop the wafer, to measure its distortions, and to prepare a suitable transparency (if a transparency is used). The cost of the "down time" for a lithography exposure tool, for example one on a synchrotron X-ray source, can be significant. In such a case, an alternative embodiment may be used to essentially eliminate such "down time," thereby reducing costs. Prior to using the exposure tool, distortions in the mask are measured off-line, and optionally the distortions in the wafer may be measured off-line as well. Based on the off-line measured distortions, the required compensations are calculated in advance, so that no time is lost while using the exposure tool itself The novel compensation method allows any source of distortion to be corrected—for example, distortion appearing in the mask as manufactured, distortion that only develops in the mask over time, or distortion in the wafer—in the latter case, particularly systematic distortions that are repeated from one wafer to the next.

This compensation method is simplified in the particular case of a scanned exposure using X-rays from an electron storage ring, since at any given time a correction need only be applied in the immediate vicinity of the line currently exposed by the X-ray beam. Two light beams may be used, one forming a line image just above, and one just below the X-ray beam. FIG. 1 illustrates one embodiment in accordance with the present invention in a storage ring beam line. The transparency partially transmits the light, and is scanned synchronously with the mask and wafer. Preferably, the lamp is a line source perpendicular to the plane of the paper. For clarity, only the beam forming a line image below the X-ray beam is shown; in practice some of the components could be shared by the light beams both above and below the X-ray beam. Intensity differences between the two beams cause differential mask expansion in the vertical direction, compensating vertical distortion, while intensity variations common to both beams compensate in the horizontal distortion; see FIGS. 7(*a*), 7(*b*), and 7(*c*). (It is understood that the designations "horizontal" and "vertical" refer to a direction parallel to the line being exposed by the radiation, and a direction perpendicular to that line, respectively.)

The loads produced by localized heating of the mask may be used to restore the mask to an undistorted condition, or to match an existing distortion pattern on the wafer. This ability gives membrane masks a flexibility that rigid masks lack. Instead of making the mask and the exposure tool as perfect and as fixed as possible, a task that is rapidly becoming a critical technical barrier to nanoscale and VLSI lithography, the adaptable mask in an image placement feedback system in principle allows the image placement accuracy to be made as good as the ability to measure it.

In another alternative embodiment, a mask may be fabricated and handled so that in use it is nearly free of distortion. This alternative embodiment preferably employs the following sequence of steps: (1) forming a fiducial grid on the mask prior to the formation of the masking pattern, preferably by interferometric lithography, and preferably in or on the membrane; (2) an optional step of characterizing the fiducial grid prior to formation of the masking pattern, for example by means of a holographic-phase-shifting interferometer, such as that shown for example in FIG. 8, and as otherwise described in M. Lim et al., *J. Vac. Sci. Technol. B*, vol. 17, pp. 2703–2706 (1999); and in K. Murooka et al., "Membrane-mask distortion correction: analytical and experimental results," paper to be presented at the International Conference on Electron, Ion, and Photo Beam Technology and Nanofabrication (Palm Springs, Calif., May 30 to Jun. 2, 2000); (3) forming the masking pattern on the membrane, for example an X-ray absorber pattern in the case of an X-ray mask; (4) measuring the fiducial grid again, for example with a holographic-phase-shifting interferometer, to determine the distribution of distortion associated with, or caused by, the masking pattern; (5) calculating the stress distribution that produced the distortion distribution determined in step (4), and calculating from the stress distribution a heat-input distribution to compensate or correct the distortion distribution; and (6) applying the calculated heat input distribution to the mask.

Two techniques, an analytical method and a finite elements method, for calculating a heat-input distribution to compensate or correct a measured distortion distribution, are disclosed in (unpublished) pending proposal to DARPA BAA 00-4 (prepared Feb. 8, 2000), a complete copy of which is being submitted with this application as originally filed in the United States Patent and Trademark Office, and the complete disclosure of which is hereby incorporated by reference.

An advantage of using such a fiducial grid and the associated interferometric means of measuring distortion of the fiducial grid is that these measurements may be made while the mask is located in an exposure apparatus in preparation for exposure. Moreover, the measurement can be performed while the heat input is being applied, and hence during the actual exposure, allowing active feedback to the heat input.

FIG. 8 depicts a holographic phase-shifting interferometer that may be used in making these measurements. As compared to an interferometric lithography system such as is known in the art, the holographic phase-shifting interferometer has three primary modifications: (1) A fluorescent or non-fluorescent screen is placed in front of one pinhole to capture the interference pattern between the reflected and back-diffracted beams; (2) A piezoelectric transducer pushes the beam-splitter, which in turn causes a phase shift in one of the arms; and (3) A CCD camera (not shown) is used to record the fringe patterns.

The light focused on the mask deposits heat, resulting in a temperature distribution T(X,Y) in the mask membrane, and hence in-plane displacements in that membrane. The magnitude of these displacements depends on the location within the mask, the locations at which the heat is deposited, the gap between the mask and the wafer, and the material properties of the mask membrane, such as its coefficient of thermal expansion and its Young's modulus.

Under the approximation of steady state conditions, the input heat is exactly balanced by heat lost from the mask. Neglecting heat flow in the plane of the mask, and assuming that the wafer is at a constant temperature, much of the heat flow from the mask results from thermal conduction across the gap, at a rate inversely proportional to the gap dimension. We have $$\text{Heat Loss} \propto \left(\frac{C_1}{g} + C_2\right)\delta T \quad (1)$$

where g is the distance of the gap, $\delta T = \delta T(X,Y)$ is the difference in temperature between the wafer and the mask, $C_1$ is proportional to the heat lost through the gap, and $C_2$ is proportional to the heat lost by all other mechanisms. Since the in-plane displacement is directly proportional to the magnitude of the temperature distribution within the mask, if $\delta T=0$ for at least one place on the mask, we may write $$\text{Displacement} = \frac{p}{\frac{C_1}{g} + C_2} \quad (2)$$

$$= \frac{gp}{C_1 + C_2 g}$$

where p is the power (in the form of heat) deposited on the mask by light.

Experimentally-determined values of $C_1$ and $C_2$ are given in Table I for three particular masks: an AT&T-Bell Labs boron nitride mask that was 15 years old at the time of the measurements, and more modern IBM silicon and silicon carbide masks.

TABLE I

Properties of Masks Tested

| Manufacturer | AT & T-Bell Labs | IBM | IBM |
| --- | --- | --- | --- |
| Membrane | Boron nitride | Silicon | Silicon carbide |
| Membrane Thickness | 8 µm | 2 µm | 2 µm |
| Absorber | Gold | Gold | Tantalum silicide |
| Absorber Thickness | 0.7 µm | NA | 0.6 µm |

TABLE I-continued

Properties of Masks Tested

| Manufacturer | AT & T-Bell Labs | IBM | IBM |
| --- | --- | --- | --- |
| Absorber Coverage | 100% | 70% | 10% |
| Membrane Size | 72 mm Diameter | 40 × 40 mm | 26 × 33 mm |
| Total Mask Thickness | 5.7 mm | 6.4 mm | 7.6 mm |
| Small Gap Sensitivity (nm/W/µm) | ±5 | ±7 | ±11 |
| Small Gap Sensitivity (ppm/W/10 µm air gap) | 0.7 | 1.75 | 3.3 |
| $C_1$ (W) | 186 | 143 | 143 |
| $C_2$ (W/µm) | 0.47 | 0.62 | 0.47 |

Figure 1:
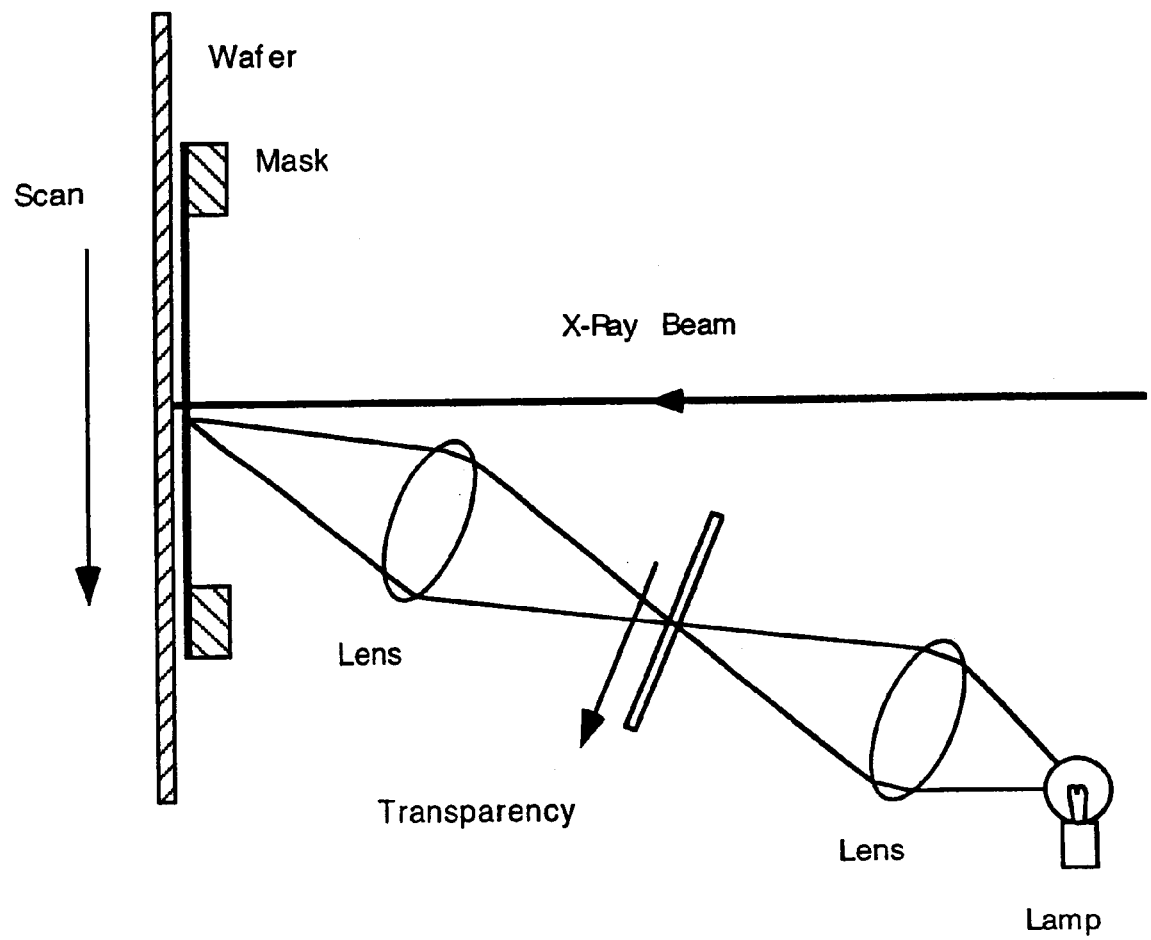
FIG. 1 illustrates one embodiment in accordance with the present invention in a storage ring beam line.
Figure 2:
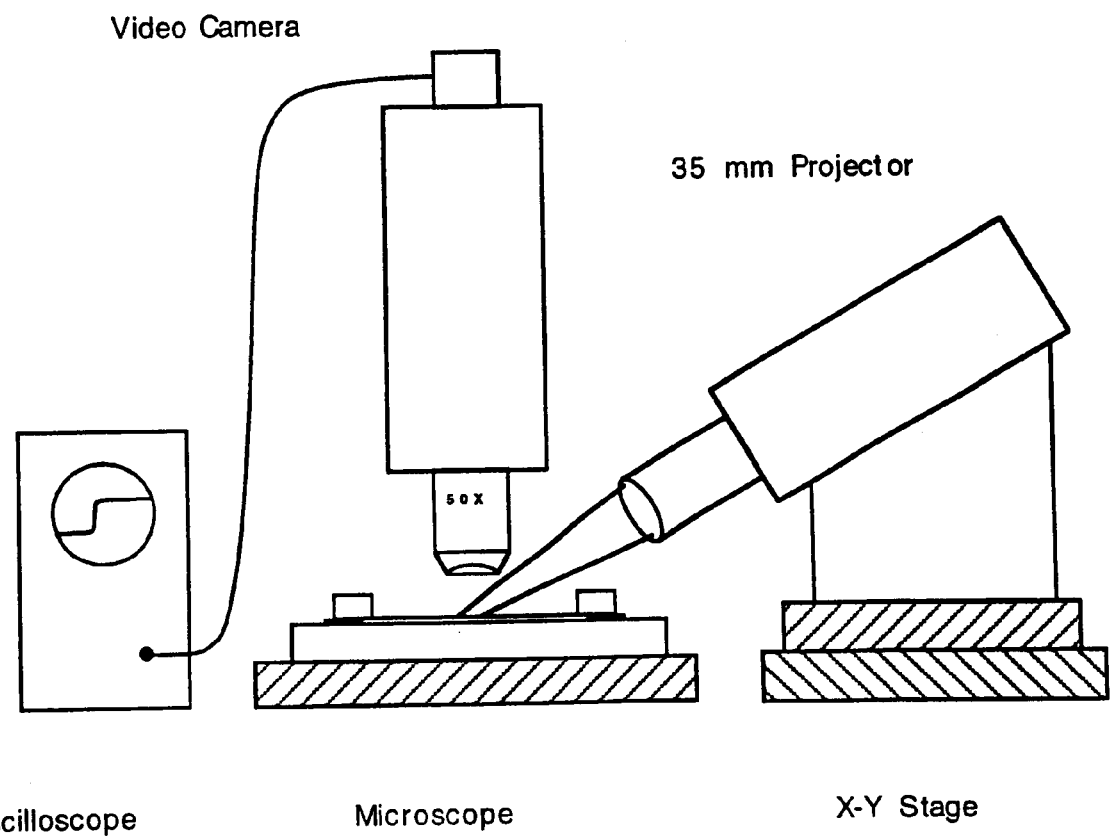
FIG. 2 illustrates schematically the experimental apparatus used for measurements of thermal displacements on X-ray masks.

Measurements of thermal displacements on X-ray masks were performed on a microscope with a 50×, 0.55 NA, ultra-long working distance objective (Olympus ULWD MS Plan 50× microscope objective, Olympus America Inc., Melville, N.Y.). FIG. 2 illustrates schematically the experimental apparatus used. The microscope was equipped with a video camera that had been modified to provide approximately twice the nominal magnification. Measurements were mad e by viewing the video signal from the camera directly with an oscilloscope; the video sweep speed was calibrated at 1.23 µm per µsec with a stage micrometer (Model F36121, Edmund Scientific Company, Barrington, N.J.). The observed video rise time was equivalent to approximately 0.6 µm, consistent with the nearly diffraction-limited spatial resolution previously observed for the microscope objective.

Masks were viewed either "face up" on an optical flat to provide a relatively large gap to the nearest cooling surface, or "face down" on the optical flat to provide a relatively small gap. In the latter case shims were used to adjust the gap, which was measured by focusing the microscope alternately on the mask and on scratches on the optical flat.

The heating light beam was obtained from a 35 mm projector that had been modified by removing its condensing optics. The projection lens was operated at nearly unit magnification, at about $f/7$, to form a 1 cm diameter image of the projection lamp. The entire projector was mounted on an X-Y stage, pointing downward at a 30° angle, so that the focused spot could be positioned throughout the mask surface, including the area directly under the objective. The area illuminated on the mask was a 10×20 mm ellipse; measurements were made along the direction of the 10 mm axis.

Mask displacements were generally measured at reduced voltage, with about 0.31 Watts in the focused light spot. The displacements were observed to be proportional to power, and to be independent of the lamp's color temperature, up to full voltage, or about 0.45 Watts in the focused spot. No out-of-plane displacements were observed, except at the largest gaps.

Figure 3:
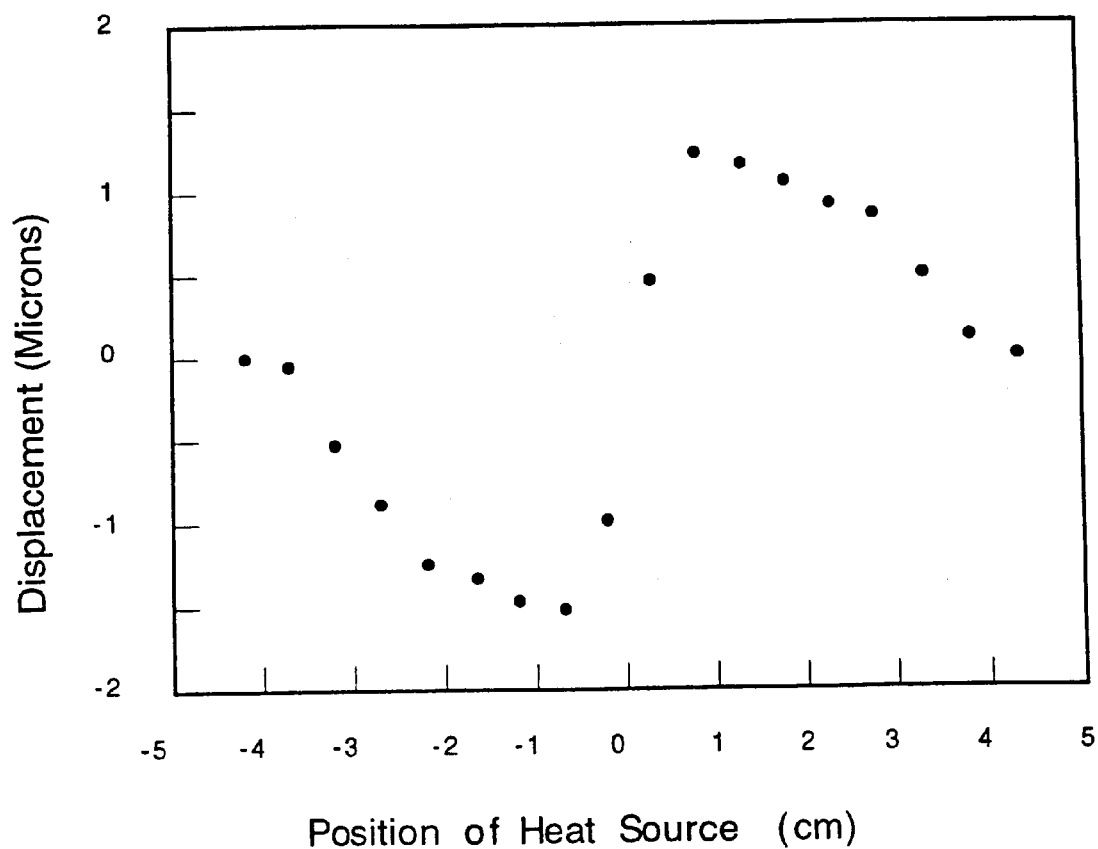
FIG. 3 illustrates in-plane thermal displacements observed at the center of the boron nitride mask as a function of the location.

In-plane thermal displacement measurements were made on a boron nitride membrane X-ray mask, manufactured by AT&T-Bell Labs in 1984. FIG. 3 illustrates the displacements observed at the center of the boron nitride mask as a function of the location of the 0.31 Watt heat input. The mask membrane was a circle 72 mm in diameter. The mask was placed face-up, to obtain an effective gap equal to the 5.7 mm thickness of the mask rim. Measurements were made at the center of the mask while the focused light spot was moved across a diameter. A maximum "peak-to-peak" displacement of approximately 3 µm was observed as the focused spot traversed from one side of the microscope objective to the other. The relatively large displacements shown in FIG. 3 were attributed primarily to the large gap between the mask and the optical flat.

Figure 4:
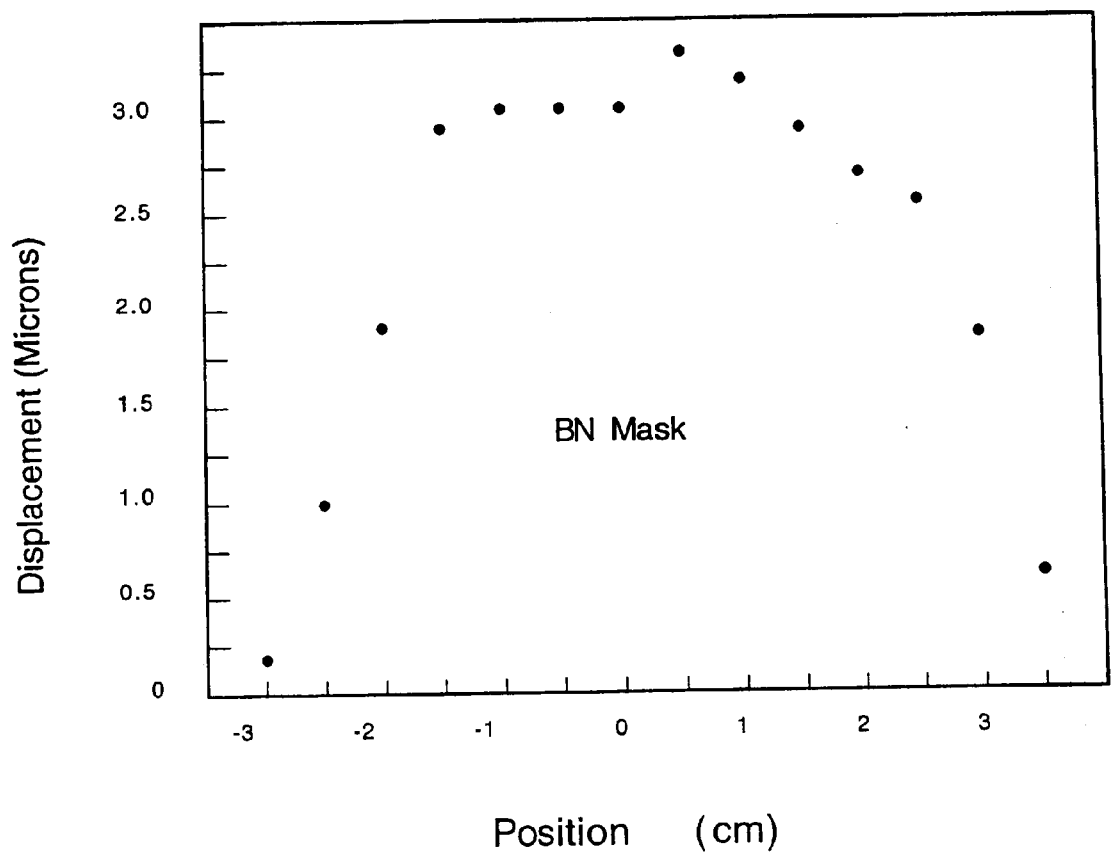
FIG. 4 depicts observed peak-to-peak displacements measured along the diameter of the boron nitride mask.

The peak-to-peak displacement was also measured as a function of the position of the focused light spot across a diameter of the mask. FIG. 4 depicts observed peak-to-peak displacements measured along the diameter of the boron nitride mask, when irradiated by 0.31 Watts of heat near the point of observation. The mask was again measured with a 5.7 mm gap to the closest surface. The mask contained 14 test patterns, arranged 5 mm apart from one another in a linear array, with the first and last patterns spaced 2.5 and 4.5 mm, respectively, from the edge of the membrane. Although the displacement was constrained to fall to zero at the edge of the membrane, it rose rapidly away from the edge, and was nearly constant over a large portion of the mask. Near the edge of the membrane, most of the peak-to-peak displacement arose from light that fell between the microscope objective and the edge. This was true even when only a portion of the light fell on the membrane. The results shown in FIG. 4 show that even a slightly oversized membrane should provide adequate correction capability at the edge of the field.

Figure 5:
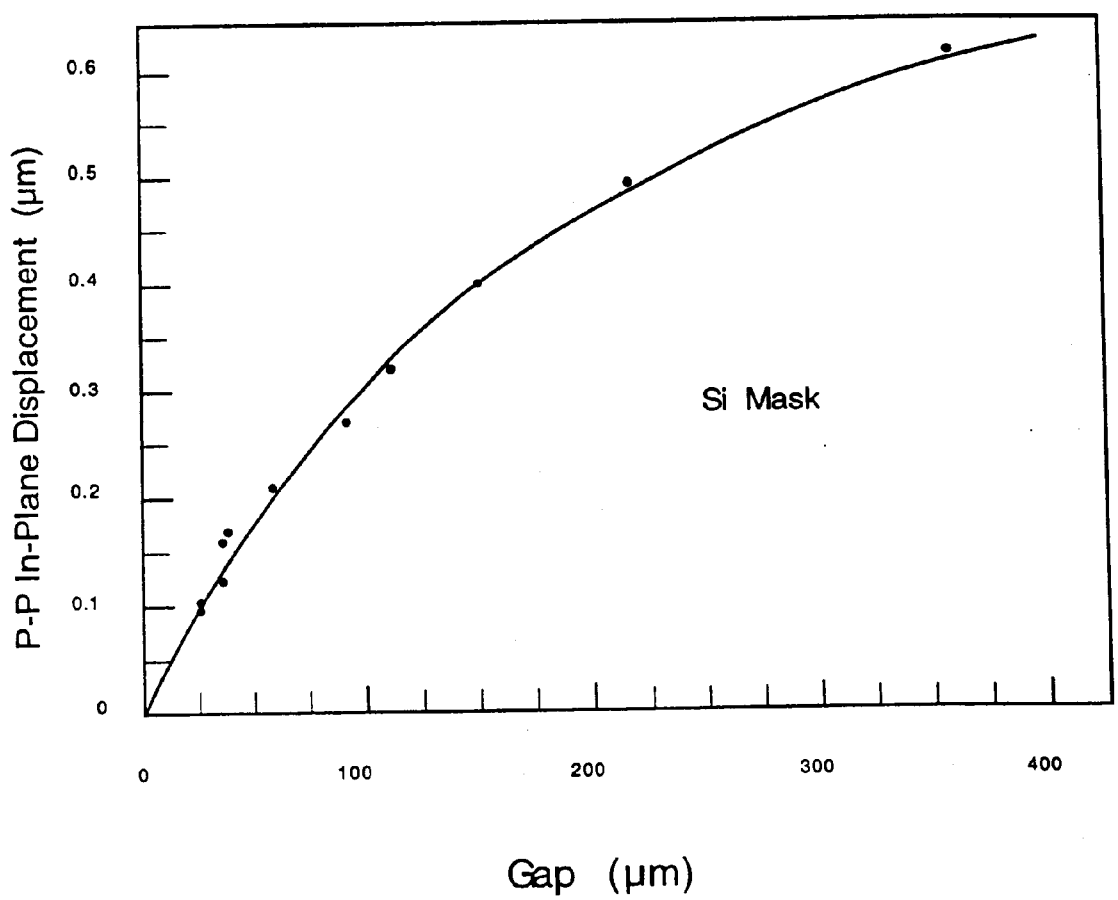
FIG. 5 shows the measured dependence of displacement on the gap for a silicon membrane mask.
Figure 6:
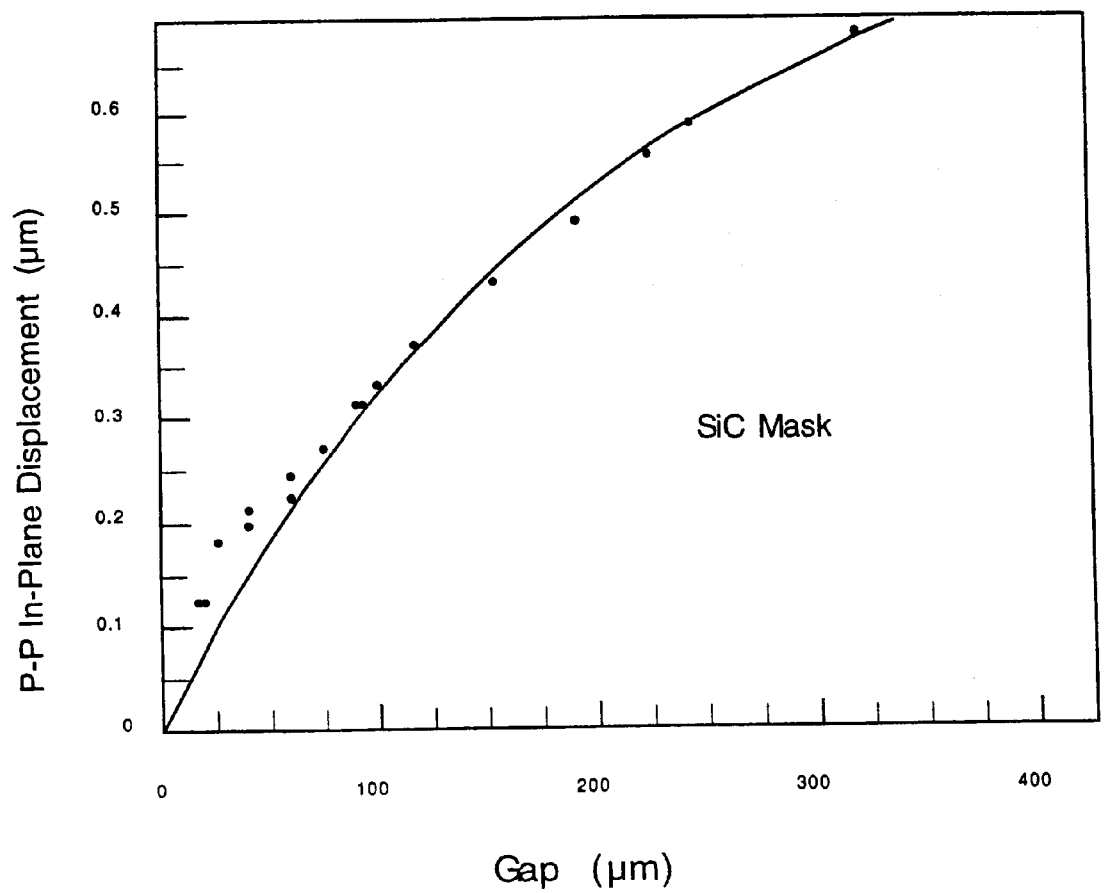
FIG. 6 shows the measured dependence of displacement on the gap for a silicon carbide membrane mask.
Figure 7A:
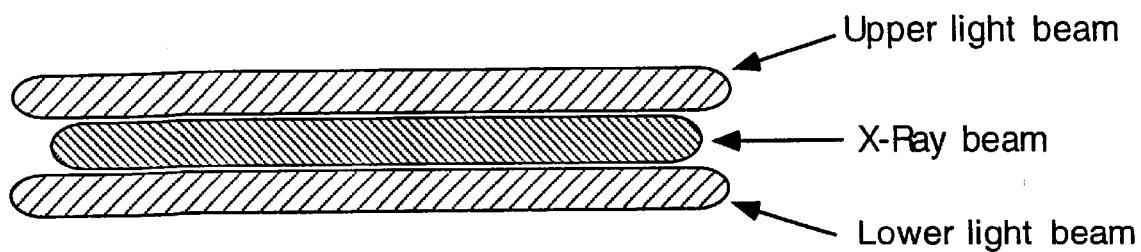
FIGS. 7(*a*), 7(*b*), and 7(*c*) illustrate, respectively, light beams in the vicinity of an X-ray beam; intensity differences between the two light beams causing differential mask expansion in the vertical direction, compensating vertical distortion; and intensity variations common to both light beams compensating horizontal distortion.
Figure 7B:
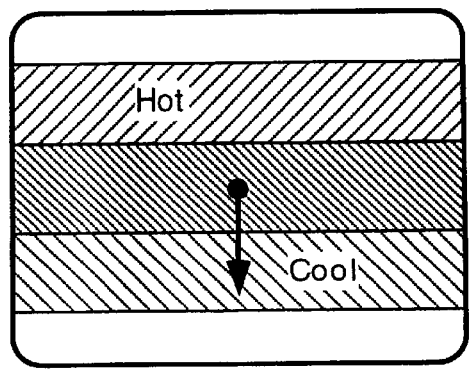
Figure 7C:
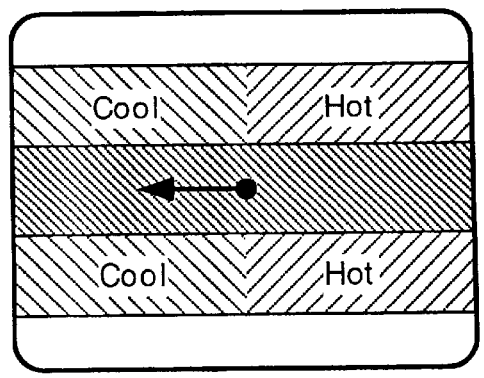
Figure 8:
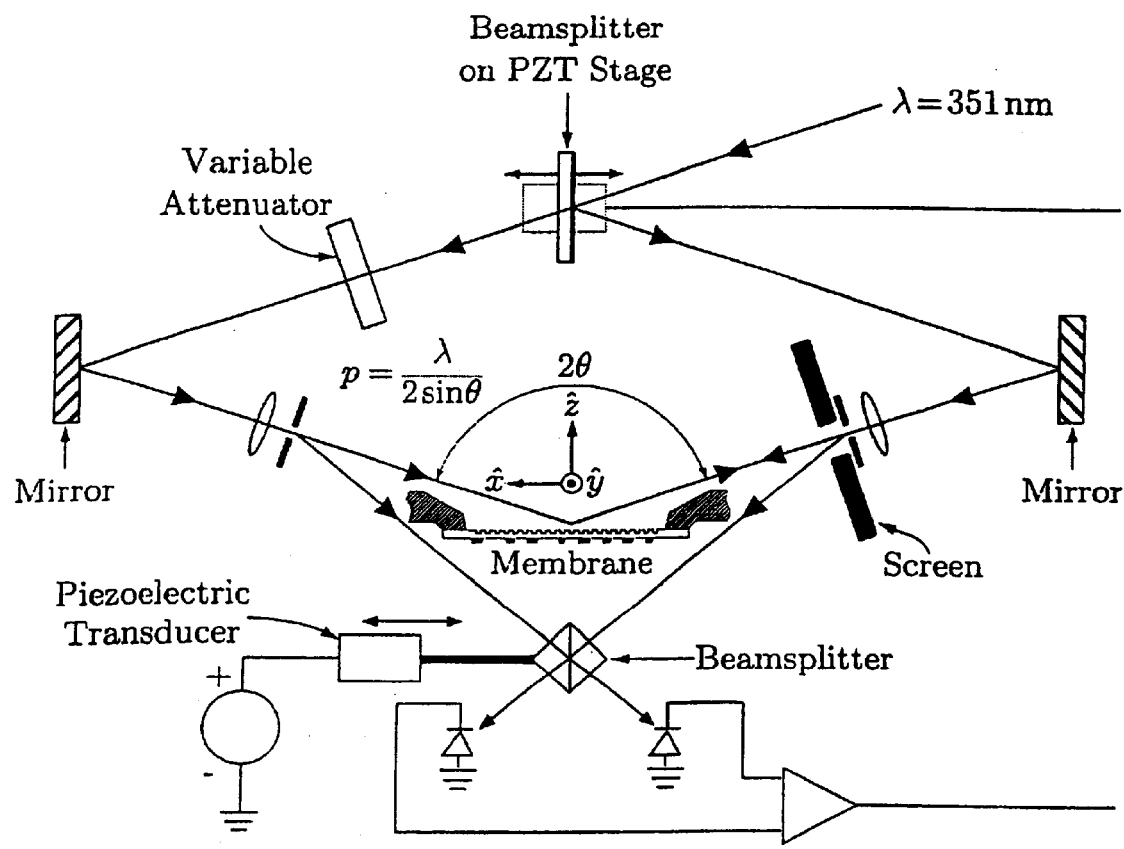
FIG. 8 depicts a holographic phase-shifting interferometer.

Since future X-ray exposures are likely to be performed at gaps less than 10 $\mu$m, the dependence of the displacement on the gap is important. FIGS. 5 and 6 show the measured gap dependence for an IBM silicon membrane mask and an IBM silicon carbide "Talon") membrane mask, respectively. FIG. 5 illustrates the measured peak-to-peak displacement for the IBM silicon membrane mask as a function of the gap. The solid curve is two times equation (2), with $C_1$=143 W, $C_2$=0.62 W/$\mu$m, and p=0.31 W. FIG. 6 illustrates the measured peak-to-peak displacement for the IBM silicon carbide membrane mask as a function of the gap. The solid curve is two times equation (2), with $C_1$=143 W, $C_2$=0.47 W/$\mu$m, and p=0.31 W. Equation (2) provided a reasonable fit to the observed measurements for both masks, as well as for the boron nitride mask, except for the smallest gaps in the case of the silicon carbide mask, where Equation (2) underestimated the measured displacements by ~35%. It was interesting that a given heat input produced the largest displacements at small gaps on this particular mask.

At gaps of several millimeters, obtained with the masks "face up," all three masks were observed to approach thermal equilibrium with time constants on the order of one second. The theory behind Equation (2) predicted that the time constant should be proportional to the displacement. As expected, the time constant was too short to be observed at the smallest gaps used in the experiments reported here.

These preliminary results demonstrated that introducing heat with a focused light beam can produce significant in-plane displacements in X-ray masks. This effect may be exploited with a send-ahead wafer to compensate for virtually any distortions that do not vary too rapidly. The magnitude of the effect observed in the initial experiments with a silicon carbide mask, about ±110 nm, or 3.3 ppm, per Watt for a 10 $\mu$m gap in air, was well within the range needed to provide useful corrections over most of the exposure field; as were the comparable magnitudes for boron nitride and silicon masks, ±50 nm per Watt and ±70 nm per Watt, respectively. To further enhance the compensation that may be achieved with this technique, the initial fabrication of the masks may be optimized accordingly: for example, a somewhat oversized membrane permits corrections over the entire field, and also allows both positive and negative magnification corrections. As another example, one could deposit on an X-ray membrane mask a low Z (low atomic mass) material or composite that: (1) comprises a substance that is highly absorbing optically, such as carbon black or another black substance, and (2) has a large coefficient of thermal expansion, and (3) does not degrade rapidly when exposed to X-rays. Such a coating would improve the mask's sensitivity to the novel compensation technique, without substantially altering the mask's X-ray characteristics.

Preliminary theoretical calculations using finite-element analysis have been used to model the thermal deformations in a square-membrane mask. One result of the model, which agreed with the experimental data reported above, was that the sensitivity of the mask to a localized thermal load was nearly constant over most of the surface of the mask, changing substantially only near the edges of the mask. This conclusion is important not only because it demonstrates nearly constant sensitivity, but also because it demonstrates the ability to correct magnification errors with only a slightly oversized membrane. Magnification correction is thus a special case of the general correction technique of the present invention.

Although this correction technique was originally developed for use with X-ray lithography, it is not limited to X-ray lithography, but may also be applied to lithography at other wavelengths and with particles other than photons, for example, visible wavelengths, ultraviolet, deep ultraviolet, electron beams, or ion beams. Membrane masks have previously not been widely used in photon lithographies other than X-ray lithography, because of the higher distortion that has typically been seen as compared to that for more rigid masks. But the novel technique for correcting distortion will allow membrane masks to be more widely used in lithographies where it has previously not found widespread application. As just one of many examples, the novel adaptive mask technique may be used to correct for variations between cameras in multi-level lithography.

Other sources of heat, e.g., the X-ray beam itself, may also introduce some in-plane displacements, which can also be compensated by appropriately placed light beams carrying comparable power.

The initial experiments reported here were conducted in air. Exposure in a helium environment, as is typical in X-ray lithography, would reduce both wanted and unwanted heat displacements as compared to those in air, since helium has a higher thermal conductivity than does air.

Miscellaneous

The complete disclosures of all references cited in this specification are hereby incorporated by reference. In the event of an otherwise irreconcilable conflict, however, the present specification shall control. Also incorporated by reference are the entire texts of the following references, none of which is prior art to the present invention: M. Feldman, "Thermal Compensation of x-ray Mask Distortions," Poster presented at the 43rd International Conference on Electron, Ion and Photo Beam Technology and Nanofabrication (Marco Island, Fla., Jun. 1–4, 1999); M. Feldman et al., "Thermal Compensation of X-ray Mask Distortions," Abstract of Poster presented at the 43rd International Conference on Electron, Ion and Photo Beam Technology and Nanofabrication (Marco Island, Fla., Jun. 1–4, 1999); K. Murooka et al., "Membrane-mask distortion correction: analytical and experimental results," paper to be presented at the International Conference on Electron, Ion, and Photo Beam Technology and Nanofabrication (Palm Springs, Calif., May 30 to Jun. 2, 2000); M. Feldman, "Thermal Compensation of X-ray Mask Distortions," *J. Vac. Sci. Technol. B*, vol. 17, pp. 3407–3410 (1999); and (unpublished) pending proposal to DARPA BAA 00-4 (prepared Feb. 8, 2000).

What is claimed:

1. A method to compensate for distortion in lithographic patterning with a membrane mask, said method comprising the following sequential steps:

(a) forming a reference pattern on a mask;

(b) forming a masking pattern on the mask;

(c) measuring the reference pattern, and determining from the changes in the measured reference pattern the distribution of distortion in the mask following said forming of the masking pattern; and (d) illuminating the mask with light, wherein the location and intensity of said illuminating light differentially heat the mask, to cause displacements within the mask, wherein the displacements compensate for the determined distortion.

2. A method as recited in claim 1, additionally comprising the step of measuring the reference pattern prior to said forming of the masking pattern; and wherein step (c) of said method comprises determining changes in the measured reference pattern after said forming of the masking pattern, as compared to the reference pattern as measured prior to said forming of the masking pattern.

3. A method as recited in claim 1, wherein the reference pattern is formed by interferometric lithography.

4. A method as recited in claim 1, wherein the reference pattern is formed on the same side of the mask as the masking pattern.

5. A method as recited in claim 4, wherein the reference pattern is measured with light from the opposite side of the mask from the masking pattern.

6. A method as recited in claim 1, wherein the reference pattern is formed on the opposite side of the mask from the masking pattern.

7. A method as recited in claim 1, wherein each of said measuring steps comprises measuring with a holographic-phase-shifting interferometer.

8. A method as recited in claim 1, wherein steps (c) and (d) of said method are performed while the mask is mounted in a lithographic apparatus for patterning a wafer.

9. A method as recited in claim 8, wherein steps (c) and (d) of said method are performed during lithographic patterning of a wafer through the mask.

10. A method as recited in claim 1, additionally comprising steps (e) and (f) below:

(e) measuring the reference pattern during said illuminating, and determining any deviations in the measured reference pattern; and (f) adjusting said illuminating so that the resulting differential heating of the mask causes displacements that further reduce the determined distortion of the reference pattern.

11. A method as recited in claim 1, wherein said irradiation comprises X-ray radiation.

12. A method as recited in claim 1, wherein said irradiation comprises ultraviolet light.

13. A method as recited in claim 1, wherein said irradiation comprises deep ultraviolet light.

14. A method as recited in claim 1, wherein said irradiation comprises visible light.

15. A method as recited in claim 1, wherein said irradiation comprises electrons.

16. A method as recited in claim 1, wherein said irradiation comprises ions.

17. A method as recited in claim 1, wherein said illuminating comprises illuminating with a modulated laser beam.

18. A method as recited in claim 1, wherein said illuminating comprises illuminating with light reflected from a micro-mirror array.

19. A method as recited in claim 1, wherein said illuminating comprises illuminating with light through a transparency, wherein the transmissivity of the transparency varies to cause the location and intensity of the transmitted light to vary to differentially heat the mask to compensate for the distortion.

* * * * *